US006967537B2

(12) United States Patent
Harima et al.

(10) Patent No.: US 6,967,537 B2
(45) Date of Patent: *Nov. 22, 2005

(54) SURFACE-MOUNT CRYSTAL OSCILLATOR HAVING AN OPENED PORTION OF THE SIDEWALLS

(75) Inventors: Hidenori Harima, Saitama (JP); Hiroaki Mizumura, Saitama (JP)

(73) Assignee: Nihon Dempa Kogyo Co. Ltd., Tokyo (*) Notice: Subject to any disclaimer, the term of this patent is extended or adjusted under 35 U.S.C. 154(b) by 27 days.

This patent is subject to a terminal disclaimer.

(21) Appl. No.: 10/620,081

(22) Filed: Jul. 15, 2003

(65) Prior Publication Data

US 2004/0085147 A1 May 6, 2004

(30) Foreign Application Priority Data

Jul. 15, 2002 (JP) .............................. 2002-206131

(51) Int. Cl.[7] .............................................. H03B 5/32
(52) U.S. Cl. ........................................ 331/68; 310/348
(58) Field of Search ...................... 331/158, 68, 116 R; 257/469; 310/348

(56) References Cited

U.S. PATENT DOCUMENTS

| 5,438,219 A | * | 8/1995 | Kotzan et al. ............... 257/469 |
| 6,587,008 B2 | * | 7/2003 | Hatanaka et al. ............. 331/68 |
| 2002/0084858 A1 | * | 7/2002 | Luff ............................. 331/68 |
| 2004/0036547 A1 | * | 2/2004 | Harima ........................ 331/158 |

FOREIGN PATENT DOCUMENTS

| JP | 2003179433 A | * | 6/2003 | ............ H03B 5/32 |
| JP | 2004153468 A | * | 5/2004 | ............ H03B 5/32 |

* cited by examiner

*Primary Examiner*—Joseph Chang
(74) *Attorney, Agent, or Firm*—Katten Muchin Rosenman LLP

(57) ABSTRACT

A surface-mounted crystal oscillator has a quartz crystal unit and a receptacle which is joined to the rear surface of the crystal unit for accommodating an IC (Integrated Circuit) chip. The receptacle has a bottom wall and sidewalls, and further, a concavity formed in at least one of its principal surfaces. The sidewalls surrounding the concavity are opened on at least one end of the receptacle, and at this opened end, the bottom wall is exposed and a notch portion is formed in the bottom wall.

9 Claims, 4 Drawing Sheets

SURFACE-MOUNT CRYSTAL OSCILLATOR HAVING AN OPENED PORTION OF THE SIDEWALLS

BACKGROUND OF THE INVENTION

1. Field of the Invention

The present invention relates to a quartz crystal oscillator having a quartz crystal unit and an oscillation circuit which uses the crystal unit for supplying an oscillation frequency signal, and more particularly to a surface-mount crystal oscillator which is amenable to miniaturization and in which a receptacle which contains an IC (Integrated Circuit) chip is bonded to the rear surface of a crystal unit.

2. Description of the Related Art

Surface-mount crystal oscillators, and in particular, surface-mount temperature-compensated crystal oscillators (TCXOs) feature light weight, compact size, and an oscillation frequency having superior stability, and these devices are therefore widely used in communication equipment used in a mobile environment, such as portable telephones. One type of surface-mount crystal oscillator is a bonded type surface-mount crystal oscillator in which a mounting substrate is installed as a receptacle on the rear surface of a crystal unit. An IC chip that together with the crystal unit makes up the oscillation circuit, and other electronic components are mounted on the mounting substrate.

FIG. 1 shows an example of the construction of this type of surface-mount crystal oscillator of the prior art. This surface-mount crystal oscillator is provided with crystal unit 1 and mounting substrate 2. Crystal unit 1 is constructed by accommodating quartz crystal blank 3 within substantially rectangular parallelepiped casing 4 and covering the opening of casing 4 by metal cover 5. Casing 4 has a shape in which a concavity is formed in one of its principal surfaces.

Crystal blank 3 is, for example, a substantially rectangular AT-cut quartz crystal blank, and although not shown here, excitation electrodes are formed opposite each other on the two principal surfaces of the crystal blank. In addition, extension electrodes are formed on both sides of one end of crystal blank 3 to extend from the excitation electrodes. Both sides of one end of crystal blank 3 from which the extension electrodes extend are secured to terminal electrodes on the bottom surface of the concavity of casing 4 by means of conductive adhesive 7. Crystal blank 3 is thus held horizontally and connected electrically and mechanically to casing 4.

A pair of connection terminals 6a are provided at both ends of one diagonal of the outer side of the bottom surface of casing 4. These connection terminals 6a are each connected to respective terminal electrodes which connect to crystal blank 3 by way of conductive paths formed in casing 4. In addition, ground terminals 6b are provided at both ends of the other diagonal of the outer side of the bottom surface of casing 4. Ground terminals 6b are electrically connected to metal cover 5.

Mounting substrate 2 is composed of ceramic, has a substantially rectangular planar shape, and has a concavity or recess formed in one of its principal surfaces. More specifically, mounting substrate 2 is made up by substantially rectangular planar bottom wall 8 and sidewalls 9 which are formed in a substantially rectangular frame shape. Sidewalls 9 are provided around the entire outer perimeter of mounting substrate 2, thereby defining the concavity. This concavity accommodates IC chip 10, in which an oscillation circuit connected to crystal unit 1 is integrated, and two chip capacitors 11. IC chip 10 may incorporate a temperature compensation mechanism which compensates the temperature dependency of the oscillation frequency of the crystal oscillator. As chip capacitors 11, a variety of large-capacitance capacitors which are difficult to integrate inside IC chip 10 may be arranged, including bypass capacitors between the power supply and ground, capacitors for coupling with a succeeding stage, or CR filter capacitors for suppressing noise which is produced by the temperature compensation mechanism.

Connection terminals 12a corresponding to connection terminals 6a of crystal unit 1, and ground terminals 12b corresponding to ground terminals 6b of crystal unit 1 are provided on the upper surfaces of sidewalls 9 which surround the concavity on mounting substrate 2. In addition, mounting terminals 14 including terminals such as a power supply terminal, ground terminal, output terminal, and AFC (Auto Frequency Control) terminal are provided on the principal surface of mounting substrate 2 on which the concavity is not formed. These mounting terminals 14 electrically connect to corresponding terminals on IC chip 10. IC chip 10 is also electrically connected to connection terminals 12a and ground terminals 12b. Finally, when this crystal oscillator is a temperature-compensated crystal oscillator, write terminals are provided on the outer surfaces of sidewalls 9 for writing temperature compensation data to the temperature compensation mechanism inside IC chip 10.

This crystal oscillator is assembled by using, for example, solder to connect connection terminals 6a and ground terminals 6b of crystal unit 1 to connection terminals 12a and ground terminals 12b of mounting substrate 2. Crystal unit 1 and mounting substrate 2 can therefore be fabricated in parallel, meaning that this type of surface-mount crystal oscillator can be manufactured with high efficiency. Further, since the electrical characteristics of crystal unit 1 can be checked before joining crystal unit 1 with mounting substrate 2 which is equipped with IC chip 10, this crystal oscillator offers the additional advantage of preventing the waste of expensive IC chips 10 when crystal units 1 having inadequate characteristics occur.

When fabricating mounting substrate 2, a ceramic substrate is first prepared in sheet form having a size which corresponds to a multiplicity of mounting substrates 2. Concavities corresponding to each individual mounting substrate have been formed in the ceramic sheet. A multiplicity of mounting substrates 2 can therefore be fabricated simultaneously by splitting this sheet ceramic substrate along break lines which extend in the horizontal and vertical directions.

With the further development of miniaturization of surface-mount crystal oscillators in recent years, however, mounting substrates having planar dimensions of, for example, 3.2 mm×2.5 mm have come into use. When the planar dimensions become this small, the problem arises that the concavity of mounting substrate 2 in the above-described surface-mount crystal oscillator can accommodate no more than IC chip 10 and can no longer accommodate chip capacitors 11.

As a countermeasure, portions of sidewalls 9 of mounting substrate 2 can be removed and chip capacitors 11 then arranged in these portions, as shown in FIG. 2. In other words, sidewalls 9 are not formed in the central areas of each of a pair of mutually opposed edges of mounting substrate 2, whereby the surface of bottom wall 8 is exposed and chip capacitors 11 are arranged in these areas. Since portions of sidewalls 9 are not provided, the concavity of mounting substrate 2 is open at the two longitudinal ends of mounting substrate 2.

The adoption of mounting substrate 2 in which the concavity is open in the two longitudinal end directions, however, raises problems in fabrication of mounting substrate 2. FIGS. 3A and 3B are figures for explaining the division of the sheet ceramic substrate into individual mounting substrates. As previously described, mounting substrates 2 are fabricated by dividing sheet ceramic substrate 15 corresponding to a multiplicity of mounting substrates along break lines A—A and B—B which are extend in two-dimensional directions. FIG. 3B shows a sectional view of sheet ceramic substrate 15 along break line A—A. When dividing ceramic substrate 15, a v-shaped groove is formed in the upper surface of sidewalls 9 along the break lines to facilitate splitting. In addition, a v-shaped groove is also formed on the rear surface of sheet ceramic substrate 15 which is opposite the v-shaped groove in the upper surface of sidewalls 9. However, this v-shaped groove cannot be formed at positions in which sidewalls 9 have been removed, i.e., on the exposed surface of bottom wall 8, because the thickness of the ceramic substrate is reduced in these areas. When v-shaped grooves are formed in this way, splitting can be easily achieved along break lines B—B along which the thickness of ceramic substrate 15 is uniform. Along break lines A—A, however, the variation in the thickness of ceramic substrate 15 and the lack of V-shaped grooves at the open-end portions of sidewalls 9 causes the stress to disperse to the thin portions of the substrate. This results in such problems as uneven breaks in sheet ceramic substrate 15 along break lines A—A and the occurrence of damaged mounting substrates 2, whereby productivity drops and yield is extremely degraded.

SUMMARY OF THE INVENTION

It is an object of the present invention to provide a surface-mount crystal oscillator which is amenable to miniaturization and which features high productivity.

The object of the present invention is achieved by a surface-mount crystal oscillator which has a crystal uni, and a receptacle for accommodating an IC (Integrated Circuit) chip, the receptacle being bonded to a rear surface of the crystal unit, wherein the receptacle includes a bottom wall and sidewalls, a concavity is formed in at least one principal surface of the receptacle, the sidewalls surrounding the concavity are opened on at least one longitudinal end of the receptacle, and a notch portion is formed in said bottom wall at a position corresponding to the opened portion of the sidewalls.

In the present invention, the receptacle is preferably a mounting substrate composed of ceramic. Opening the sidewalls surrounding the concavity at least one end of the receptacle and further, providing a notch portion in the bottom wall at the opened position, can prevent damage which occurs when dividing the receptacle from the sheet substrate, and further, raises the productivity of the crystal oscillator. In addition, the present invention is amenable to the miniaturization of a surface-mount crystal oscillator because an electronic component can be mounted on the bottom wall at the opened portion in which the sidewalls have been removed. As this electronic component, for example, a chip capacitor can be mounted, and a surface-mount crystal oscillator which incorporates a capacitor of relatively large capacitance can therefore be obtained.

DETAILED DESCRIPTION OF THE INVENTION

Figure 1:
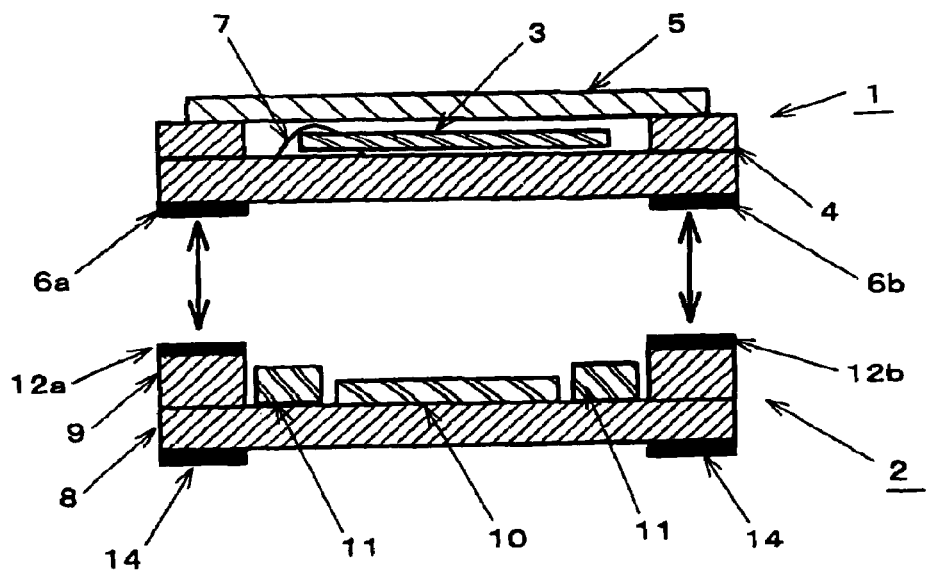
FIG. 1 is an exploded sectional view of the assembly of a surface-mount crystal oscillator of the prior art.
Figure 2:
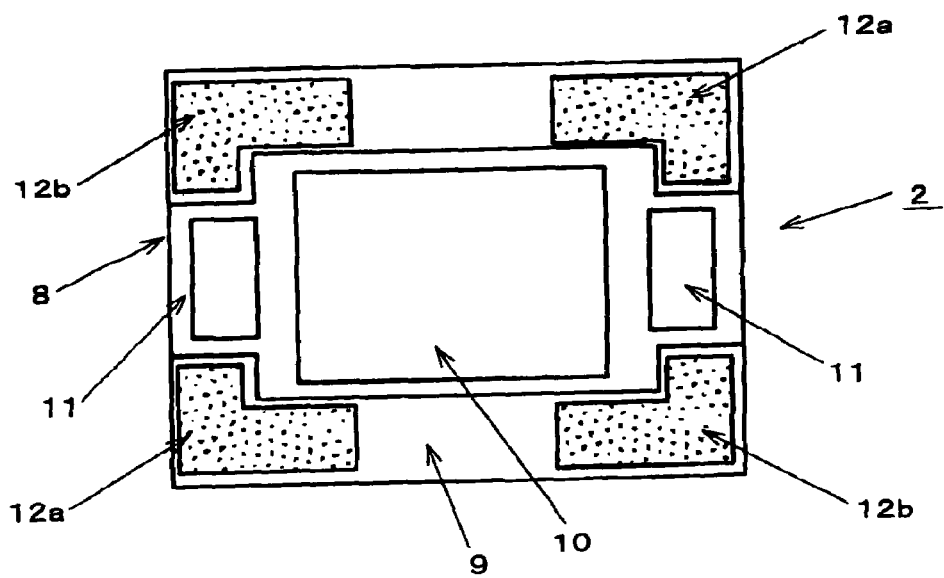
FIG. 2 is a plan view of a mounting substrate used in the surface-mount crystal oscillator shown in FIG. 1.
Figure 4A:
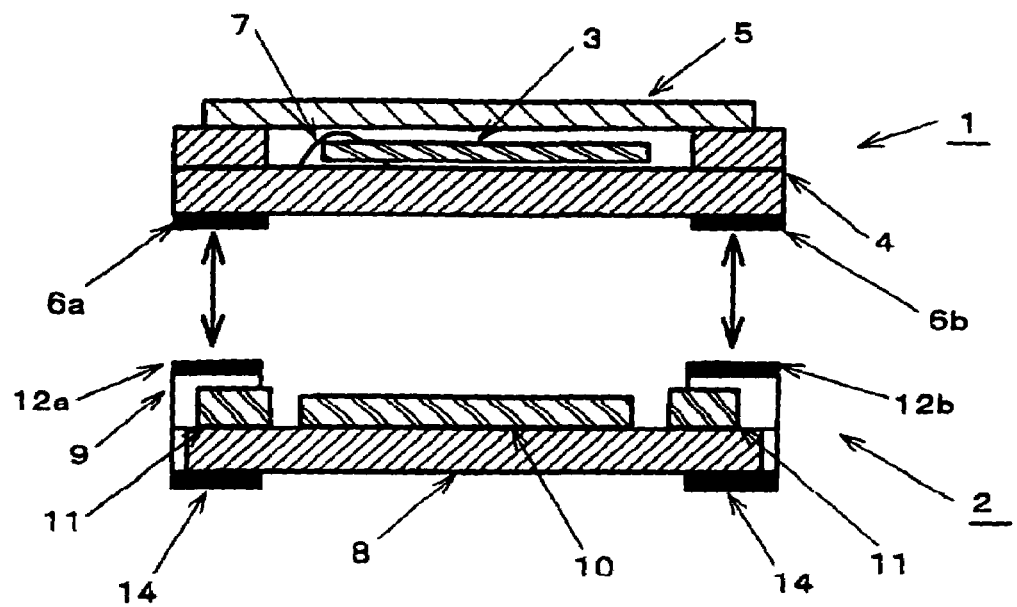
FIG. 4A is an exploded sectional view showing the assembly of a surface-mount crystal oscillator according to an embodiment of the present invention.
Figure 4B:
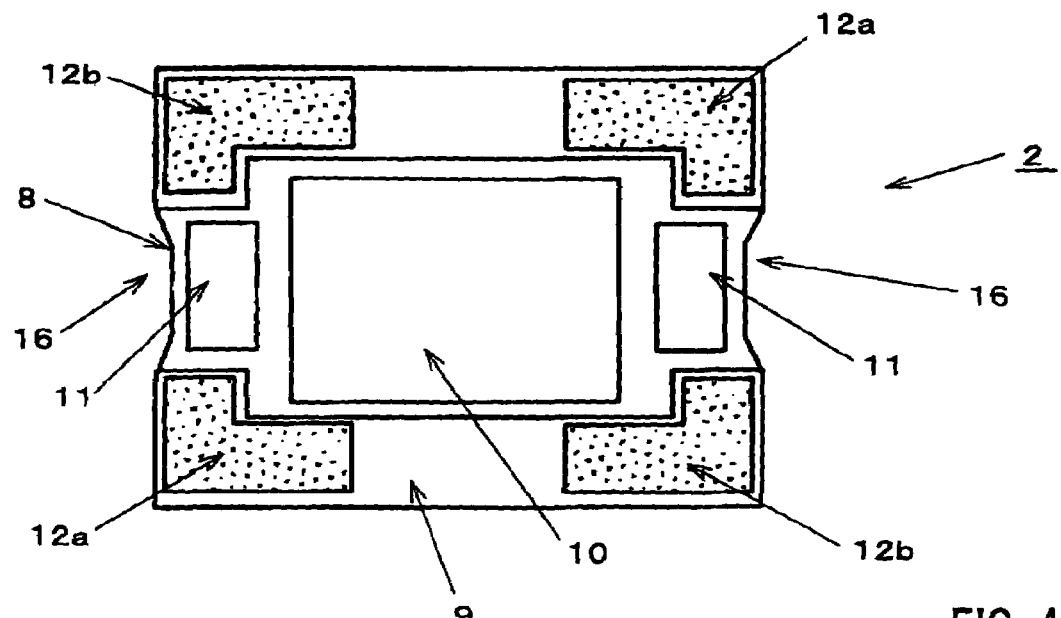
FIG. 4B is a plan view of the mounting substrate used in the surface-mount crystal oscillator shown in FIG. 4A.

In FIGS. 4A and 4B which show a surface-mount crystal oscillator according to a preferred embodiment of the present invention, constituent elements which are identical to elements in FIGS. 1 and 2 are identified by the same reference numerals, and redundant detailed explanation is not repeated here.

As previously described, a surface-mount crystal oscillator is formed by bonding mounting substrate 2 as a receptacle to the rear surface of crystal unit 1. In the same manner as shown in FIG. 2, mounting substrate 2 used in the present embodiment has a concavity wherein portions of sidewalls 9 at both end sides of mounting substrate 2 are removed such that the concavity is open in the direction of both longitudinal ends of mounting substrate 2. Further, notch portions 16 are formed in bottom wall 8 at positions corresponding to the opened portions of sidewalls 9 such that each side portion of bottom wall 8 is scraped out in the planar shape of bottom wall 8 from the open end of sidewalls 9 in an angled bracket shape. IC chip 10 is arranged in the center of the concavity of mounting substrate 2, and chip capacitors 11 are arranged on bottom wall 8 in the areas where sidewalls 9 are removed.

Figure 5A:
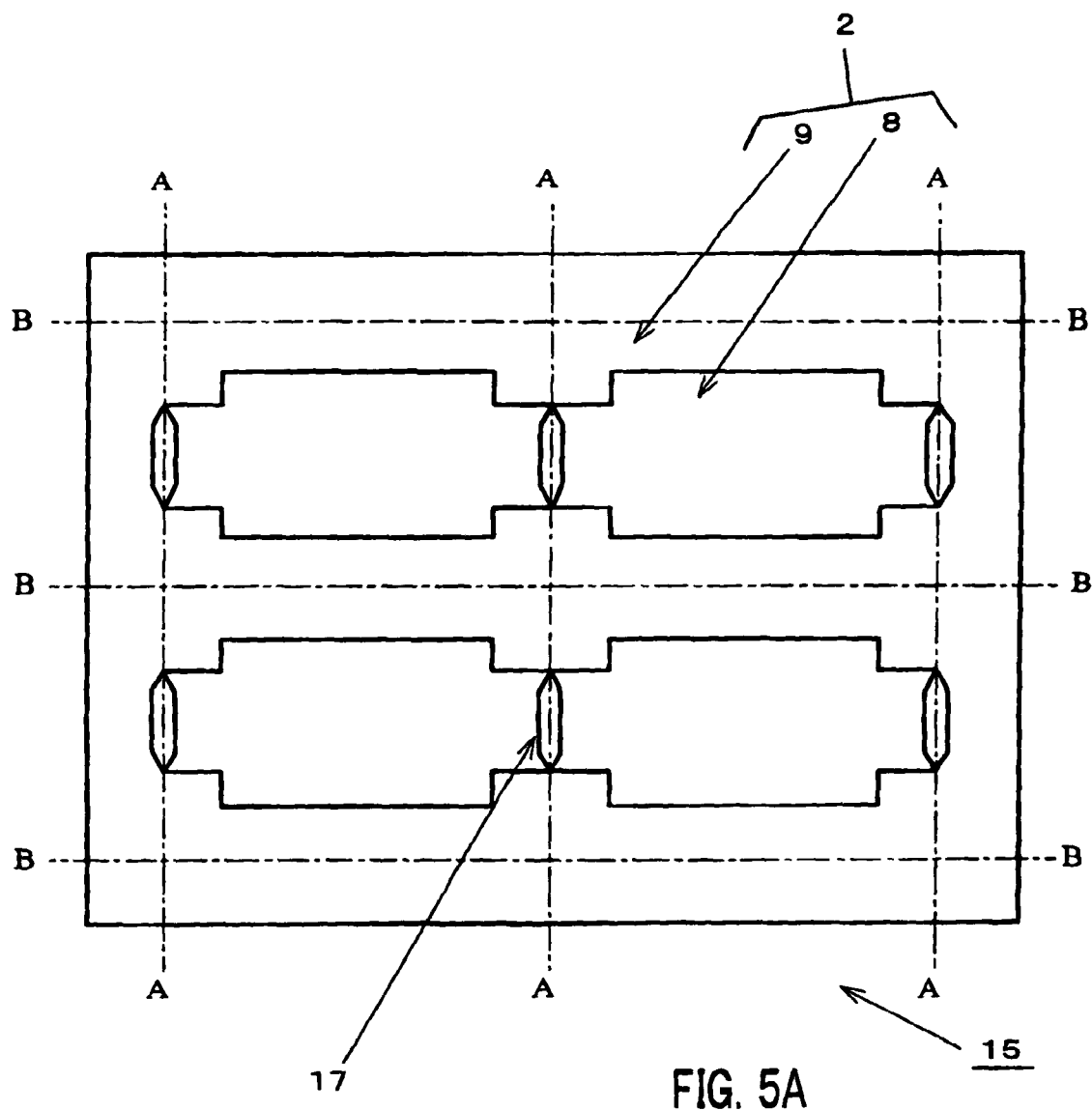
FIGS. 5A and 5B are a plan view and a sectional view of a sheet ceramic substrate which makes up the mounting substrate, respectively.
Figure 5B:
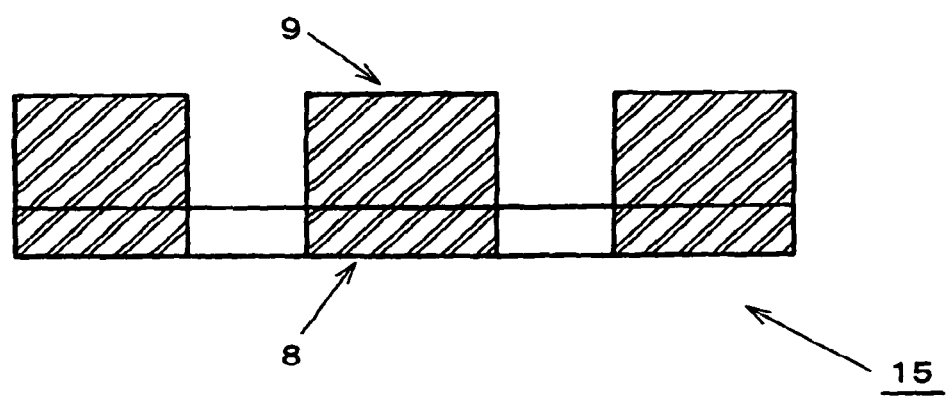

Explanation next regards the steps of fabricating mounting substrate 2 of this type. FIGS. 5A and 5B show sheet ceramic substrate 15 used for obtaining this mounting substrate 2.

Figure 3A:
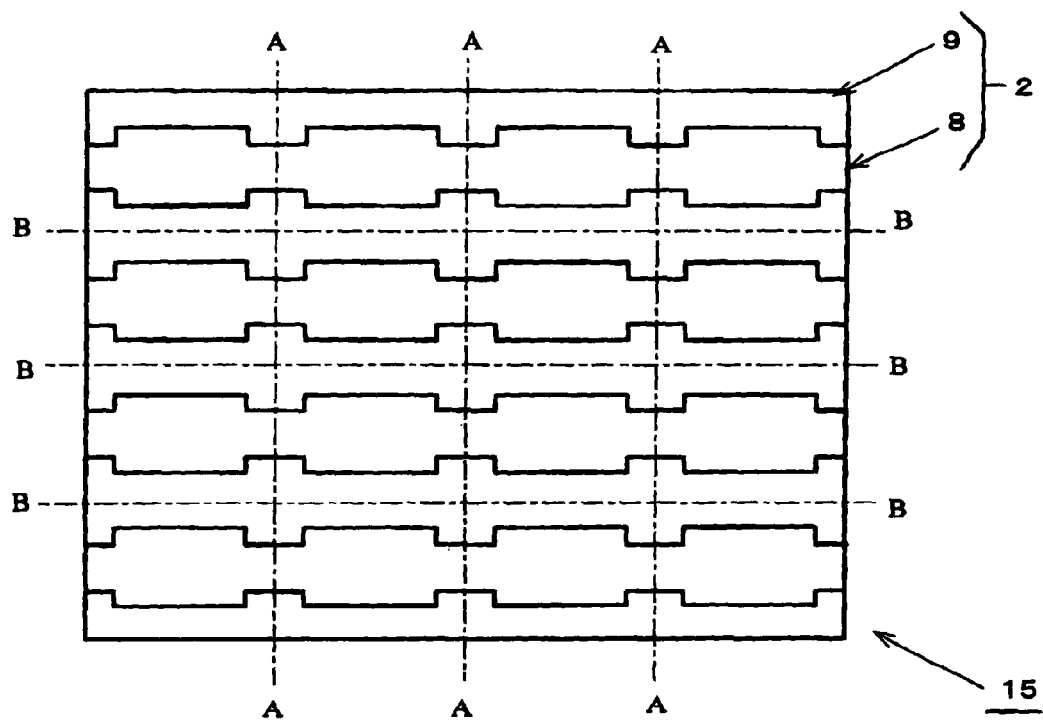
FIGS. 3A and 3B are a plan view and a sectional view of the sheet ceramic substrate which makes up a mounting substrate, respectively.
Figure 3B:
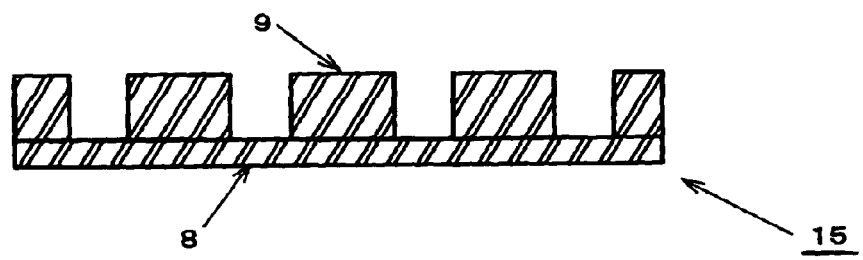

As with the ceramic substrate shown in FIGS. 3A and 3B, ceramic substrate 15 shown in FIGS. 5A and 5B corresponds to a multiplicity of mounting substrates, and a multiplicity of mounting substrates 2 can be fabricated simultaneously by cutting this ceramic substrate 15 along break lines A—A and break lines B—B. In this ceramic substrate 15, slit perforations 17 are formed which correspond to notch portions 16 in mounting substrate 2. It should be clear that perforations 17 are formed along break lines A—A in bottom wall 8 in the areas where sidewalls 9 are removed. The above-described notch portions 16 are formed by splitting ceramic substrate is along break lines A—A. In this embodiment as well, v-shaped grooves are formed on the upper surface of sidewalls 9 along break lines A—A and B—B. These v-shaped grooves are also formed on the rear surface of bottom wall a as in the above-described case. FIG. 5B is a sectional view of ceramic substrate 15 taken along break line A—A.

Through the use of sheet ceramic substrate 15 of this construction, the thickness of ceramic substrate 15 is uniform not only along break lines B—B but along break lines A—A as well when cutting ceramic substrate 15 because no ceramic substrate exists in the portions of perforations 17. Concentrations of stress can therefore be avoided, and as a result, well-defined cut surfaces can be obtained, and further, damage to mounting substrate 2 can be prevented when splitting the ceramic substrate. As a result, an improvement can be obtained in the productivity of mounting substrates 2, and consequently, the productivity of the crystal oscillators.

In addition, because sidewalls 9 are opened in the direction of the two ends of mounting substrate 2 and bottom wall 8 is exposed, chip capacitors 11 can be arranged as electronic components on bottom wall a in these areas. A high-function and compact surface-mount crystal oscillator which incorporates capacitors each having relatively large capacitance can therefore be obtained.

In the above-described embodiment, sidewalls 9 were opened on both ends of mounting substrate and two chip capacitors were mounted on a single mounting substrate 2, but sidewall 9 may be opened on only one end of mounting substrate 2. In addition, other electronic components such as inductors and thermistors can be mounted as necessary in place of the chip capacitors.

In the above-described example, the surface of mounting substrate 2 in which the concavity is formed is bonded to the rear surface of crystal unit 1, but the surface of mounting substrate 2 in which the concavity is not formed may also be bonded to the rear surface of crystal unit 1.

Instead of the above-described type of mounting substrate 2, a structure can also be used as the receptacle which has an H-shaped section with a concavity in both principal surfaces, the crystal blank being accommodated in one concavity and an IC chip and other electronic components being accommodated in the other concavity.

What is claimed is:

1. A surface-mount crystal oscillator, comprising:
   a crystal unit; and
   a receptacle for accommodating an IC chip, said receptacle being bonded to a rear surface of said crystal unit;
   wherein said receptacle comprises a bottom wall and sidewalls, a concavity is formed in at least one principal surface of said receptacle, the sidewalls surrounding said concavity are opened on at least one longitudinal end of said receptacle, and a notch portion is formed in said bottom wall at a position corresponding to the opened portion of said sidewalls.

2. The surface-mount crystal oscillator according to claim 1, wherein said IC chip, together with said crystal unit, constitutes an oscillation circuit.

3. The surface-mount crystal oscillator according to claim 1, wherein an electronic component is arranged on said bottom wall at the position corresponding to the opened portion of said sidewalls.

4. The surface-mount crystal oscillator according to claim 3, wherein said electronic component is a chip capacitor.

5. The surface-mount crystal oscillator according to claim 1, wherein said receptacle is a mounting substrate having a substantially rectangular planar shape, and said sidewalls surrounding said concavity are opened at both longitudinal ends of said mounting substrate.

6. The surface-mount crystal oscillator according to claim 5, wherein chip capacitors are arranged on said bottom wall at positions corresponding to each opened portion of said sidewalls.

7. The surface-mount crystal oscillator according to claim 1, wherein said crystal unit and said receptacle are each constructed as separate units, and are assembled by bonding said crystal unit and said receptacle together.

8. The surface-mount crystal oscillator according to claim 5, wherein said crystal unit and said mounting substrate are each constructed as separate units, and are assembled by bonding said crystal unit and said mounting substrate together.

9. The surface-mount crystal oscillator according to claim 5, wherein said mounting substrate is composed of ceramic.

* * * * *